United States Patent
Huang et al.

(10) Patent No.: US 9,618,856 B2
(45) Date of Patent: Apr. 11, 2017

(54) METHOD OF OVERLAY IN EXTREME ULTRA-VIOLET (EUV) LITHOGRAPHY

(71) Applicant: Taiwan Semiconductor Manufacturing Co., Ltd., Hsin-Chu (TW)

(72) Inventors: Chia-Ching Huang, Su-ao Township (TW); Chia-Hao Hsu, Hsinchu (TW); Chia-Chen Chen, Hsinchu (TW)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 0 days.

(21) Appl. No.: 15/191,831

(22) Filed: Jun. 24, 2016

(65) Prior Publication Data
US 2016/0306285 A1    Oct. 20, 2016

Related U.S. Application Data

(63) Continuation of application No. 14/029,844, filed on Sep. 18, 2013, now Pat. No. 9,405,204.

(51) Int. Cl.
| | | |
|---|---|---|
| *G03B 27/52* | (2006.01) | |
| *G03F 7/20* | (2006.01) | |
| *H01L 21/683* | (2006.01) | |
| *C23C 16/04* | (2006.01) | |

(Continued)

(52) U.S. Cl.
CPC ........ *G03F 7/70708* (2013.01); *C23C 16/042* (2013.01); *C23C 16/34* (2013.01); *C23C 16/56* (2013.01); *G03F 7/70633* (2013.01); *G03F 7/70783* (2013.01); *H01L 21/6833* (2013.01); *Y10T 29/49155* (2015.01)

(58) Field of Classification Search
CPC ... C23C 16/042; C23C 14/042; C23C 16/507; H01L 21/6833; H01L 21/6831; H01L 21/76802; H01L 21/76843; H01L 29/786; H01L 2933/0033; H01L 33/62; G03F 7/20; G03F 7/70708; G03F 1/00; G03F 1/22; G03F 7/3021; G03F 7/70616; G03F 7/707; G03F 7/7078
See application file for complete search history.

(56) References Cited

U.S. PATENT DOCUMENTS

| | | |
|---|---|---|
| 4,875,765 A | 10/1989 | Vandenberg et al. |
| 5,684,566 A | 11/1997 | Stanton |
| 5,793,473 A | 8/1998 | Koyama et al. |

(Continued)

FOREIGN PATENT DOCUMENTS

| | | |
|---|---|---|
| EP | 0793120 A1 | 9/1997 |

OTHER PUBLICATIONS

U.S. Appl. No. 14/022,355, filed Sep. 10, 2013.

(Continued)

*Primary Examiner* — Mesfin Asfaw
(74) *Attorney, Agent, or Firm* — Eschweiler & Potashnik, LLC

(57) ABSTRACT

The present disclosure relates to a deformable reticle chuck. In some embodiments, an extreme ultraviolet (EUV) deformable reticle chuck has a substrate of insulating material with a plurality of protrusions extending outward from a first side of the substrate. A resistive material is arranged along a second side of the substrate below the plurality of protrusions. The resistive material is configured to expand in response to an applied current or voltage to adjust a shape of a reticle.

20 Claims, 7 Drawing Sheets

(51) Int. Cl.
   *C23C 16/34*  (2006.01)
   *C23C 16/56*  (2006.01)

(56) References Cited

U.S. PATENT DOCUMENTS

| | | |
|---|---|---|
| 5,888,675 A | 3/1999 | Moore et al. |
| 5,986,795 A | 11/1999 | Chapman et al. |
| 6,840,638 B2 | 1/2005 | Watson |
| 6,842,277 B2 | 1/2005 | Watson |
| 6,897,940 B2 | 5/2005 | Sogard |
| 8,029,947 B2 | 10/2011 | Hickman |
| 8,284,379 B2 | 10/2012 | Phillips |
| 8,555,208 B2 | 10/2013 | Hickman |
| 2006/0216912 A1 | 9/2006 | Bristol et al. |
| 2007/0165312 A1 | 7/2007 | Aoki et al. |
| 2007/0253070 A1 | 11/2007 | Venema |
| 2010/0033704 A1 | 2/2010 | Shiraishi |
| 2010/0071720 A1 | 3/2010 | Ehm et al. |
| 2010/0284015 A1 | 11/2010 | Sewell |
| 2010/0295088 A1 | 11/2010 | D'Evelyn et al. |
| 2011/0292363 A1 | 12/2011 | Ivey et al. |
| 2012/0141922 A1 | 6/2012 | Deweerd |

OTHER PUBLICATIONS

U.S. Appl. No. 14/051,683, filed Oct. 11, 2013.
Notice of Allowance dated Jan. 22, 2015 U.S. Appl. No. 14/051,683.
Non-Final Office Action dated Jun. 8, 2015 for U.S. Appl. No. 14/022,355.
Final Office Action dated Dec. 17, 2015 U.S. Appl. No. 14/022,355.
Notice of Allowance dated Mar. 28, 2016 for U.S. Appl. No. 14/029,844.
Notice of Allowance dated Jun. 20, 2016 for U.S. Appl. No. 14/022,355.

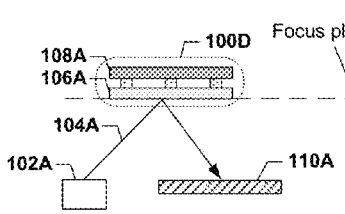
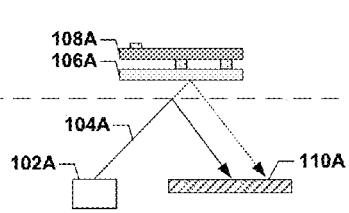
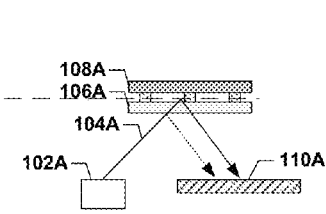
Fig. 1A    Fig. 1B    Fig. 1C
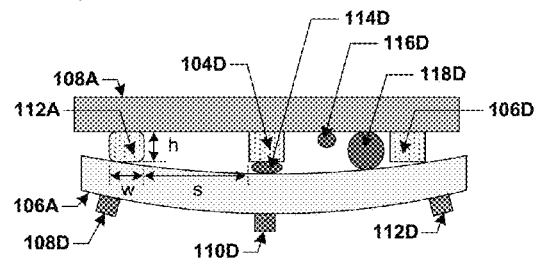
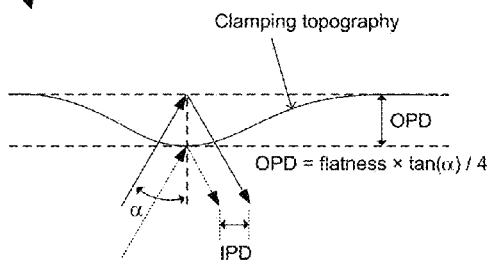
Fig. 1D    Fig. 1E

US 9,618,856 B2

METHOD OF OVERLAY IN EXTREME ULTRA-VIOLET (EUV) LITHOGRAPHY

REFERENCE TO RELATED APPLICATION

This Application is a Continuation of U.S. application Ser. No. 14/029,844 filed on Sep. 18, 2013, the contents of which is hereby incorporated by reference in its entirety.

BACKGROUND

The following disclosure relates to extreme ultra-violet (EUV) lithography and methods to improve reticle overlay while maintaining manufacturing throughput for semiconductor fabrication process.

BRIEF DESCRIPTION OF THE DRAWINGS

FIGS. 1A-1C illustrate EUV illumination tool configurations.

FIGS. 1D-1E illustrate clamping topology of a reticle surface and resultant distortion of reflected radiation.

DETAILED DESCRIPTION

Figure 2A:
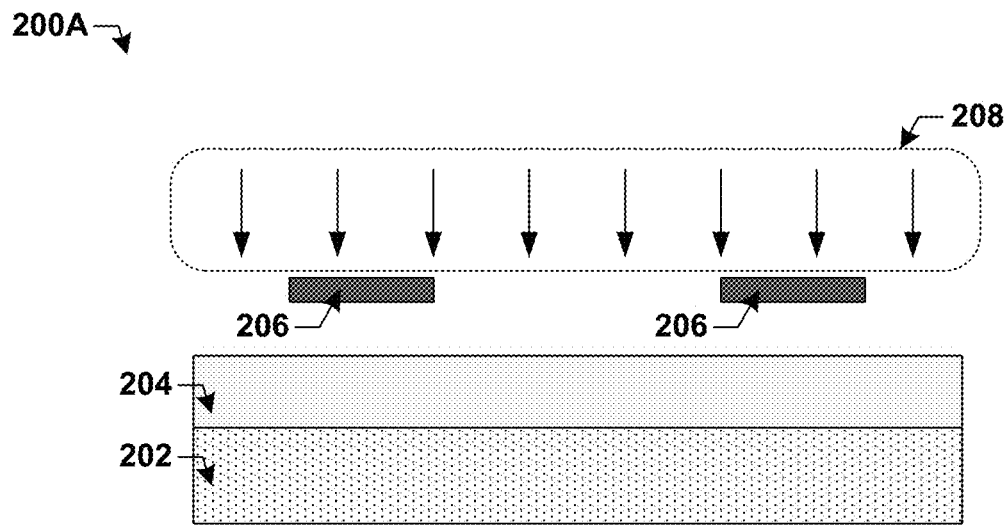
FIGS. 2A-2L illustrate some embodiments of deformable electrostatic chuck formation and operation.

The present disclosure will now be described with reference to the drawings wherein like reference numerals are used to refer to like elements throughout, and wherein the illustrated structures are not necessarily drawn to scale. It will be appreciated that this detailed description and the corresponding figures do not limit the scope of the present disclosure in any way, and that the detailed description and figures merely provide a few examples to illustrate some ways in which the inventive concepts can manifest themselves.

FIG. 1A illustrates an EUV illumination tool configuration 100A, comprising a radiation source 102A configured to supply radiation 104A to a reticle 106A which is mounted to an electrostatic chuck 108A. The reticle 106A reflects the radiation 104A to a surface of a semiconductor workpiece 110A, to form a pattern on the surface. The radiation source 102A may comprise a synchrotron, or a plasma source such as ionized xenon (Xe) or tin (Sn) produced by a laser or thermal excitation, and emits EUV radiation with wavelengths in a range of about 10 nm to about 130 nm. The reticle 106A contains a multilayer mirror comprising alternating reflective (e.g., Mo, Ru, etc.) and spacer layers (e.g., Si) configured to reflect incident radiation through Bragg interference, resulting in a peak reflectance wavelength of about 13.5 nm, which allows for a finer feature resolution when patterning the semiconductor workpiece 110A than an about 193 nm wavelength lower bound of current immersion optical lithography techniques.

The reticle 106A and electrostatic chuck 108A of FIG. 1A are positioned such that the radiation source 102A supplies radiation 104A that is in focus when it arrives to the surface of the semiconductor workpiece 110A. FIG. 1B illustrates an EUV illumination tool configuration 100B which is identical to the EUV illumination tool configuration 100A, with an exception that the reticle 106A and electrostatic chuck 108A are positioned above a plane which results in a focused beam on the surface, or at a negative focus position, resulting in a lateral displacement of the radiation 104A to the right of its intended position. Similarly, FIG. 1C illustrates an EUV illumination tool configuration 100C where the reticle 106A and electrostatic chuck 108A are positioned below a plane which results in a focused beam on the surface, or at a positive focus position, resulting in a lateral displacement of the radiation 104A to the left from its intended position. This resultant overlay (OVL) error is due to the displacement of the reticle 106A and electrostatic chuck 108A from the plane of focus, and results in a degradation of the quality of the pattern formed on the semiconductor workpiece 110A.

For the embodiments of FIGS. 1A-1C, a single reflective surface (i.e., reticle 106A) is shown between the radiation source 102A and the semiconductor workpiece 110A for simplicity. Typical EUV lithography systems utilize reduction optics which include a series of reflective surfaces including condenser multilayer mirrors configured to render a divergent beam into a parallel beam and projection multilayer mirrors, as well as the reticle 106A.

In the EUV illumination tool configurations 100A-100C, the reticle 106A is clamped by the electrostatic chuck 108A by an electrostatic potential. FIG. 1D illustrates a detailed view of the reticle 106C and the electrostatic chuck 108A, where the reticle 106A is coated with first through third absorption features 108D-112D, configured to absorb incident radiation, such that the pattern is formed by reflected radiation corresponding to the first through third absorption features 108D-112D. The reticle 106A abuts first through third burls 102D-106D, which reside on a surface of the electrostatic chuck 108A, and comprise a width (w) in a range of about 100 µm to about 500 µm, a space (s) in a range of about 1.0 mm to about 5.0 mm, and a height off the bottom surface of the reticle 106A in a range of about 1.0 µm to about 100 µm. Some industry-standard electrostatic chucks utilize greater than 2,000 of such burls comprising about 1.4% of the surface area of the electrostatic chuck 108A, to support the reticle 106A.

Electrostatic clamping can achieve clamp and de-clamp times of less than 1 second with an equal or greater force than conventional vacuum chucks. In addition to OVL error due to reticle 106A misalignment, clamping topography between the reticle 106A and the electrostatic chuck 108A can result in OVL error. Clamping topography can result from burl wear or contaminants on a surface of the electrostatic chuck 108A. For instance, burl wear is observed on the first burl 112A, where corners have rounded due to repeated use, which can result in non-planar clamping. Additionally, the second burl 104D contains a flattened contaminant 114D (e.g., gold, etc.) which distorts reticle topography. And while small contaminants 116D (e.g., with a diameter less than h) between burls may not impact reticle topography, larger contaminants 118D (e.g., with a diameter greater than h) will impact reticle topography.

FIG. 1E illustrates clamping topography 100E of the reticle 106A resulting from the contaminants and other factors, which causes an out of plane distortion (OPD) of the reticle surface, resulting in a lateral displacement or in plane distortion (IPD) of the radiation. The clamping topography 100E and resultant loss of OVL control for the reticle 106A causes a degradation in pattern uniformity such as critical dimension (CD) variation, shape biasing, etc.

Accordingly, some embodiments of the present disclosure relate to a method of overlay control which utilizes a deformable electrostatic chuck. The method comprises exposing a substrate to radiation which is reflected off of a reticle. The reticle is mounted to a deformable electrostatic chuck by a plurality of raised contacts, where each raised contact is configured to independently vary in height from a surface of the deformable electrostatic chuck. After exposure of the substrate to radiation which is reflected off of the reticle, a displacement between a first alignment shape formed on a first layer disposed on a surface of the substrate and a second alignment shape formed by the exposure is measured. The height of one or more of the plurality of raised contact is changed based upon the displacement to alter a surface topology of the reticle, which negates some effects of clamping topology.

FIGS. 2A-2L illustrate cross-sectional views 200A-200K of formation and operation of a deformable electrostatic chuck. FIG. 2A illustrates a cross-sectional view 200A of a substrate 202 of insulating material which is subjected to a first pattern and etch process, where the substrate is coated with a first photoresist layer 204, aligned with a first mask 206 comprising transparent and opaque areas, and exposed to a first dose of radiation 208 such that the opaque areas which block the first dose of radiation 208 from reacting with portions of the first photoresist layer 204. In some embodiments, the insulating material comprises silicate glass or ZERODUR. In some embodiments, the first dose of radiation 208 comprises optical radiation with a wavelength of about 193 nm exposed in an immersion tool. In some embodiments, the first photoresist layer 204 comprises a positive tone photoresist such that exposed portions of the first photoresist layer 204 become soluble upon being exposed, and are subsequently removed. In some embodiments, the first photoresist layer 204 comprises a negative tone photoresist such that exposed portions of the first photoresist layer 204 become insoluble to a photoresist developer upon being exposed.

Figure 2B:
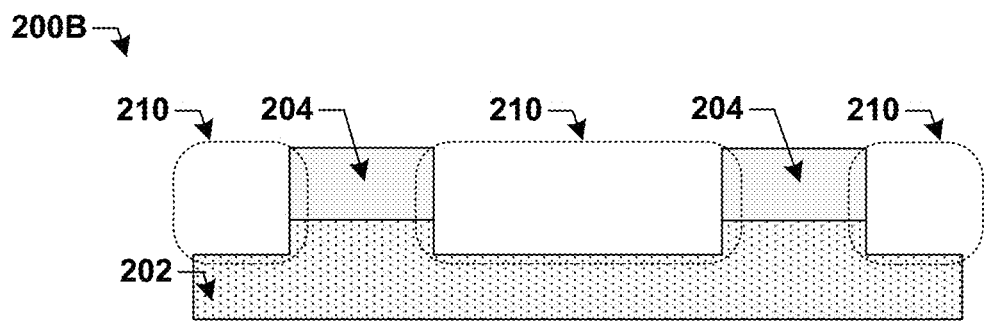
Figure 2C:
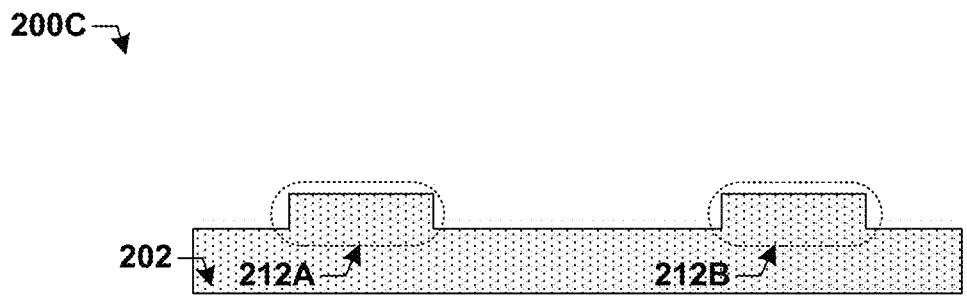

FIG. 2B illustrates a cross-sectional view 200B of the substrate 202, wherein the first pattern and etch process further comprises using a photoresist developer to dissolve the soluble portion of the first photoresist layer 204, and a first pattern of recesses 210 are formed within the exposed areas on a surface of the substrate 202 through one or more first etching processes including a dry process(es) such as a plasma etching process, wet etching process(es), or a combination thereof, as is appreciated by one of ordinary skill in the art. The remainder of the first photoresist layer 204 is then removed to produce the cross-sectional view 200C of a substrate 202 of FIG. 2C, comprising a first raised contact 212A and a second raised contact 212B.

Figure 2D:
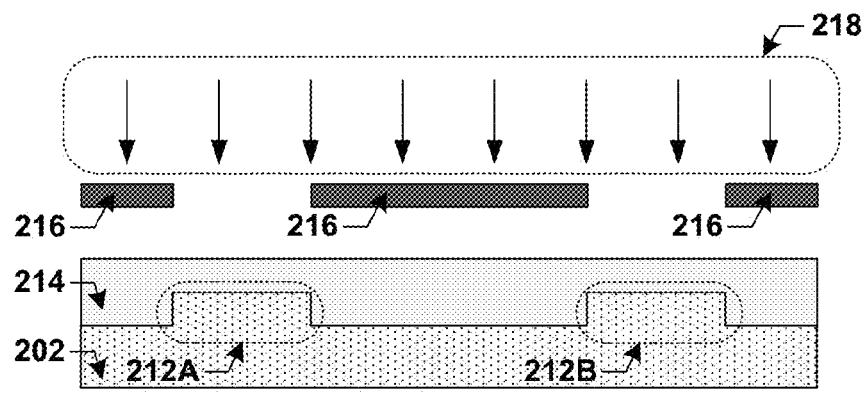
Figure 2E:
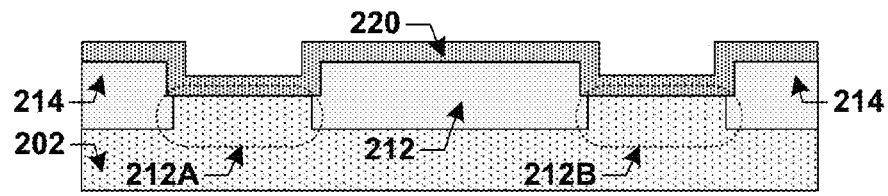
Figure 2F:
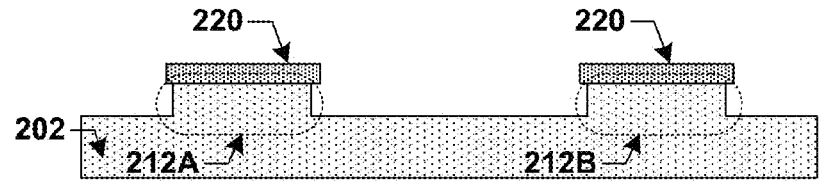

FIG. 2D illustrates a cross-sectional view 200D of the substrate 202, where a second pattern and etch process is performed. The substrate is coated with a second photoresist layer 214, aligned with a second mask 216, and exposed to a second dose of radiation 218. For the embodiments of FIG. 2D, a pattern of the second mask 216 is essentially a reverse of a pattern of the first mask 206 (i.e., opaque and transparent areas are reversed), such that transparent areas of the second mask 216 reside over the first and second raised contact 212A, 212B. Upon opening areas of the second photoresist layer 212 over the first and second raised contact 212A, 212B, a ceramic material 220 (e.g., TiN) is disposed above the substrate 202 and the second photoresist layer 212, as illustrated in the embodiments of FIG. 2E. In some embodiments, deposition of the ceramic material 220 comprises chemical vapor deposition (CVD). Some derivative CVD processes further comprise low pressure CVD (LP-CVD), atomic layer CVD (ALCVD), ultrahigh vacuum CVD (UHVCVD), reduced pressure CVD (RPCVD), or any combinations thereof. The second photoresist layer 214 is then stripped, which removes both the second photoresist layer 214 and the ceramic material 220 disposed above the second photoresist layer 214, as illustrated in the embodiments of cross-sectional view 200F of FIG. 2F.

Figure 2G:
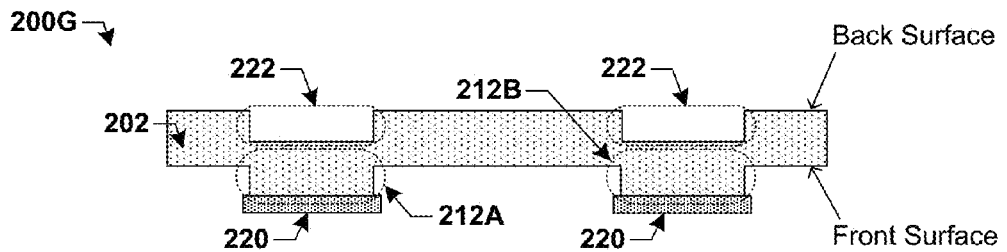

FIG. 2G illustrates a cross-sectional view 200G of the substrate 202, which has been flipped face-down relative to the cross-sectional view 200F, and etched to form a second pattern of recesses 222 on a back surface of the substrate 202. In some embodiments, the second pattern of recesses 222 is formed by coating the substrate 202 with a third photoresist layer (not shown) on the back surface, aligning with the second mask 216 from the embodiments of FIG. 2D, and exposed to a third dose of radiation (not shown). Note that formation of the second pattern of recesses 222 on the back surface of the substrate 202 utilizes the second mask 216 as in FIG. 2D, as the pattern formed in photoresist is the same.

Figure 2H:
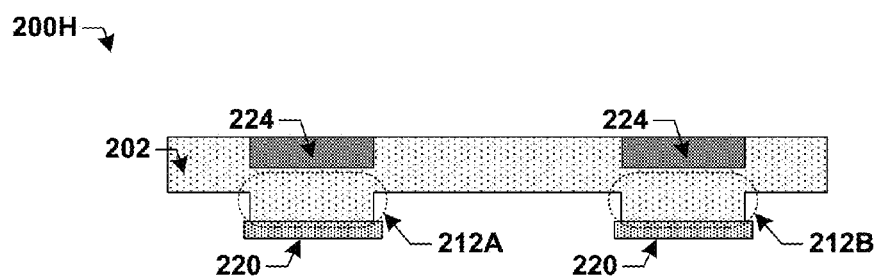

FIG. 2H illustrates a cross-sectional view 200H of the substrate 202, where a layer of highly resistive (HRI) material 224 (e.g., lightly-doped silicon dioxide) has been deposed within the second pattern of recesses 222. In some embodiments, the layer of HRI material 224 is disposed within the second pattern of recesses 222 and on the back surface, and excess HRI material is removed elsewhere from the back surface. In some embodiments, no excess HRI material is removed from the back surface, and instead the layer of HRI material 224 is separated into a plurality of "zones," wherein a single zone of HRI material corresponds to an individual recess 222, and wherein the plurality of zones of HRI material are electrically isolated from one another.

Figure 2I:
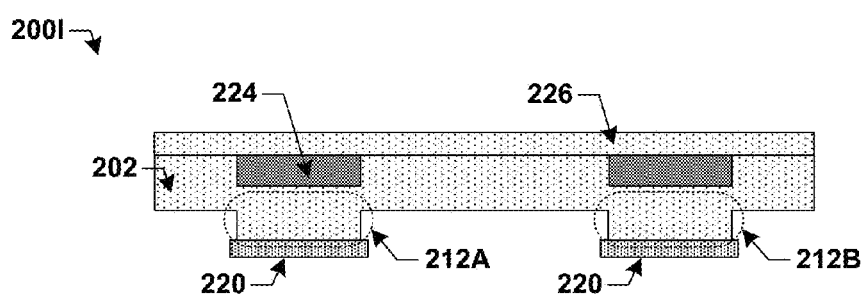
Figure 2J:
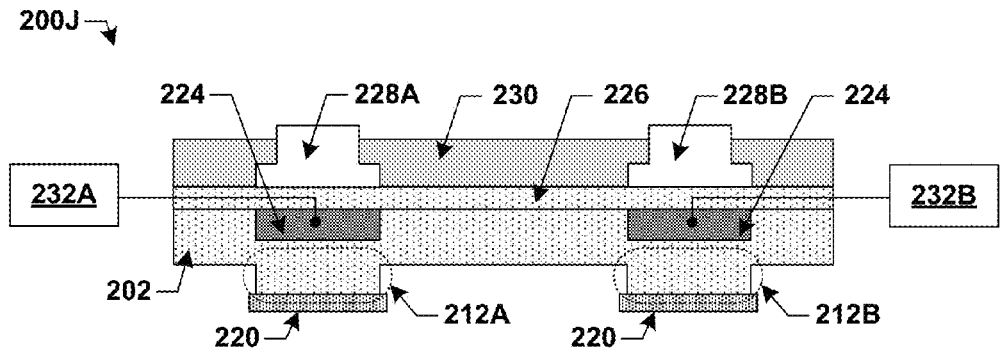

FIG. 2I illustrates a cross-sectional view 200I of the substrate 202, where a layer of the insulating material 226 has been deposited over the back surface by CVD or other appropriate method. In some embodiments, the layer of the insulating material 226 comprises silicate glass or ZERODUR. FIG. 2J illustrates a cross-sectional view 200J of the substrate 202, where a first electrode 228A and a second electrode 228B have been disposed over the layer of the insulating material 226, and within a dielectric layer 230. In some embodiments, the first and second electrodes 228A, 228B comprise copper (Cu). For the embodiments of FIGS. 2A-2L, the first and second electrodes 228A, 228B form a pattern that is essentially identical and aligned to a pattern formed by the first and second raised contact 212A, 212B, on the front surface. And, first and second electrical supplies 232A, 232B are then coupled to the HRI material 224 within the recessed areas (222) on the back surface of the substrate 202, resulting in a deformable electrostatic chuck of some embodiments of the present disclosure.

Figure 2K:
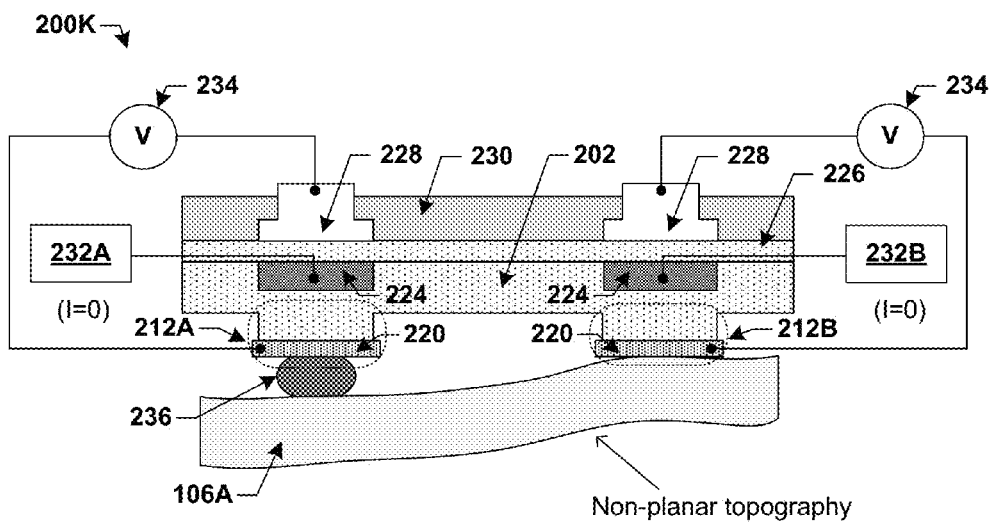
Figure 2L:
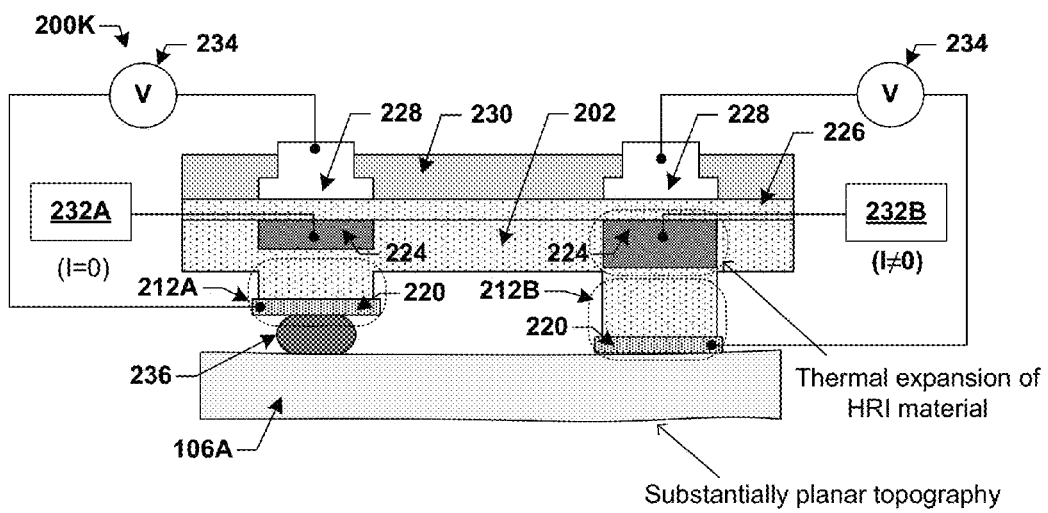

FIG. 2K illustrates an electrostatic chuck 200K of the present disclosure in an idle state, where no current is supplied to the HRI material 224. A reticle 106A is clamped by the electrostatic chuck 200K by an electrostatic potential 234 between the first and second electrodes 228A, 228B and the first and second raised contacts 212A, 212B. For the exemplary embodiments of FIG. 2K, the reticle 106A comprises a non-planar topography, resulting from a contaminant particle 236 residing on a surface of the first electrode 228A. In other embodiments, the reticle 106A comprises a non-planar topography due to intrinsic warpage of the reticle 106A, or other factors. FIG. 2L illustrates the electrostatic chuck 200K, where a non-zero current has been applied to a region of the HRI material 224 over the second raised contact 212B by the second electrical supply 232B. Due to the high resistance of the HRI material 224, heating occurs in a vicinity of the second raised contact 212B, resulting in a thermal expansion of the HRI material 224, which increases a height of the second raised contact 212B relative to a front-surface of the substrate 202, to achieve a substantially planar topography of the reticle 106A. This expansion mitigates potential OVL error associated with the non-planar topography of the reticle 106A. For the embodiments of FIGS. 2K-2L, no current is applied to a region of the HRI material 224 over a first raised contact 212A by the first electrical supply 232A. Therefore, there is no deformation of the first raised contact 212A. In general, an independent current may be applied to a the HRI material 224 over each raised contact (212A, 212B) independently to control the topography of the reticle 106A.

Figure 3:
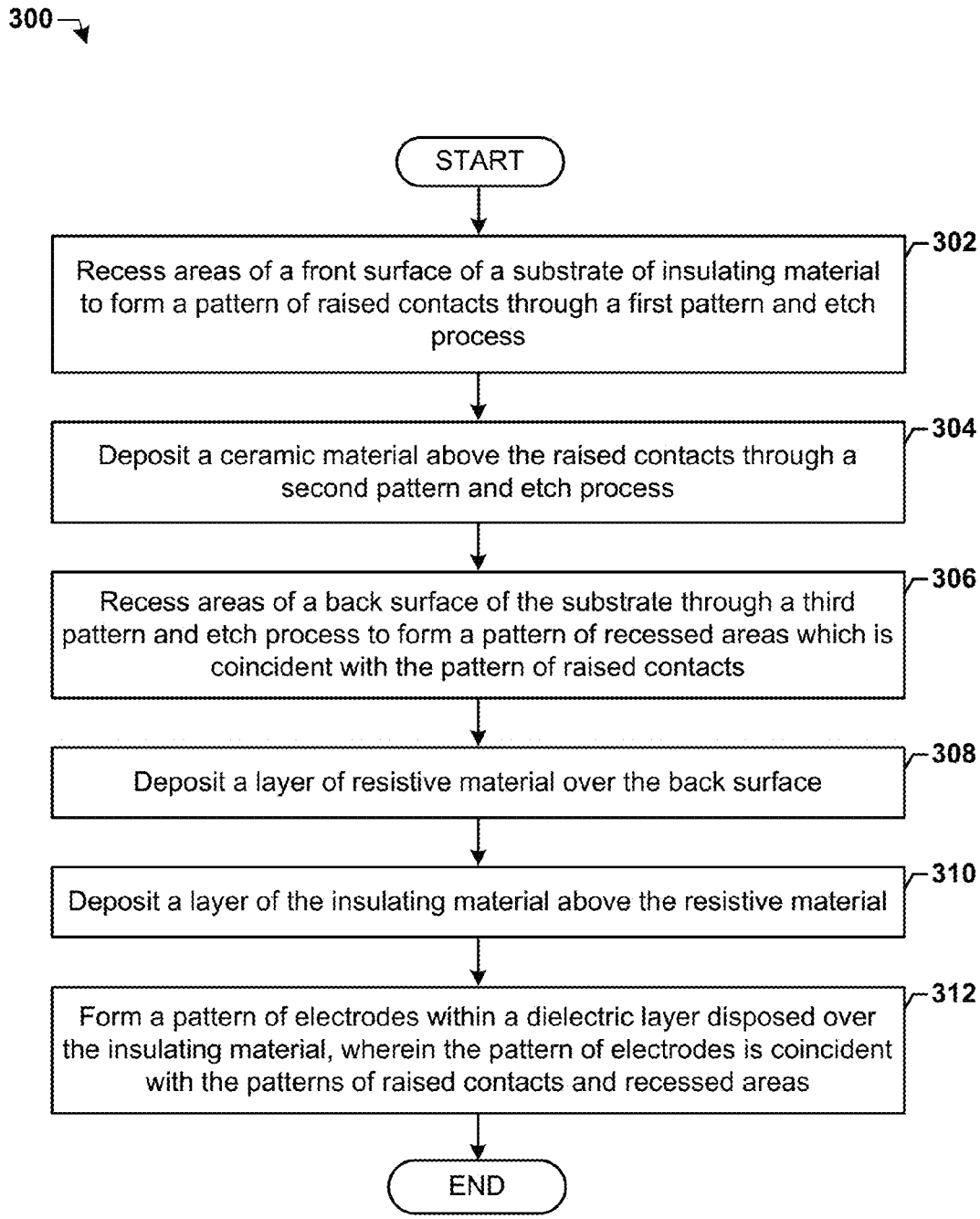
FIG. 3 illustrates some embodiments of a method of forming a deformable electrostatic chuck.

FIG. 3 illustrates some embodiments of a method 300 of forming a deformable electrostatic chuck in accordance with the embodiments of the present disclosure. While the method 300 and subsequently method 500 are illustrated and described as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 302 areas of a front surface of a substrate of insulating material are recessed to form a pattern of raised contacts through a first pattern and etch process which utilizes a first mask pattern. The substrate may comprise an ultra-low expansion (ULE) material configured to exhibit minimal thermal expansion under elevated temperature (relative to the HRI material), and may further comprise silicate glass or ZERODUR.

At 304 a second pattern and etch process is performed utilizing a second mask pattern which is a reverse of the first mask pattern (i.e., opaque and transparent areas are reversed) to deposit a ceramic material above the raised contacts and configured to act as a conductive barrier. In some embodiments, the ceramic layer comprises titanium nitride (TiN) and is deposited by CVD or derivative method.

At 306 areas of a back surface of the substrate are recessed through a third pattern and etch process which utilizes the second mask pattern to form a pattern of recessed areas which is coincident with the pattern of raised contacts.

At 308 a layer of HRI material is disposed on the back surface of the substrate, and planarized. In some embodiments, the HRI material comprises lightly-doped silicon dioxide.

At 310 a layer of the resistive material is disposed over the layer of HRI on the back surface. An individual electric supply may then be coupled to the HRI material over each recessed area on the back surface of the substrate and configured to deliver current for localized volume control of the HRI material within each individual recess.

At 312 a pattern of electrodes is formed within a dielectric layer disposed over the insulating material, wherein the pattern of electrodes is coincident with the patterns of raised contacts and recessed areas.

Figure 4:
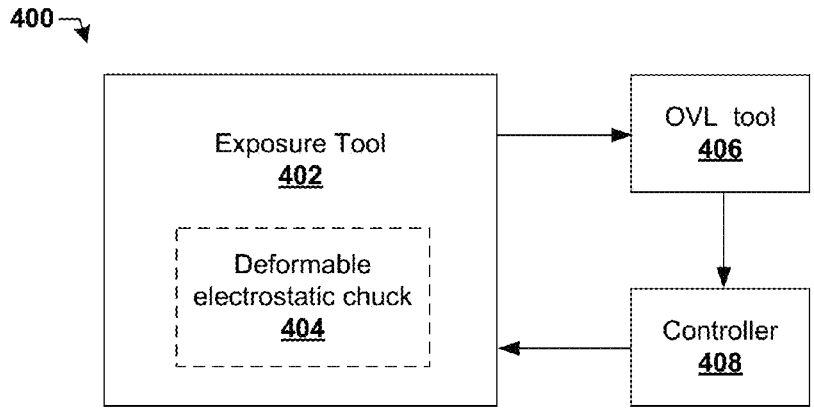
FIG. 4 illustrates some embodiments of a metrology system comprising a deformable electrostatic chuck configured to compensate for residual overlay error.

FIG. 4 illustrates some embodiments of a metrology system 400 comprising a deformable electrostatic chuck 404 configured to compensate for residual OVL error. The metrology system 400 comprises an exposure tool 402 comprising a radiation source configured to supply radiation to a reticle which is mounted on the deformable electrostatic chuck 404 as illustrated in the embodiments of FIGS. 2A-2L. The reticle reflects the radiation to a surface of a workpiece to form a pattern on the workpiece such as the embodiments of EUV illumination tool 100A of FIG. 1A. The exposure tool 402 is coupled to an overlay (OVL) measurement tool 406, which is configured to measure locations of first alignment shapes disposed on a surface of workpiece relative to location of second alignment shapes formed by the exposure tool 402, and reports a residual displacement between the first and second alignment shapes within a plane of the workpiece, where the residual displacement results from misalignment of the reticle relative to the workpiece which cannot be compensated during patterning. The OVL measurement tool 406 will determine the amount of residual misalignment that can't be compensated by measuring a magnitude and direction of a plurality of residual alignment vectors formed between the first alignment shapes and their respective second alignment shapes formed on the mask after the alignment and focus adjustment by the exposure tool 402. The distribution of the residual vectors may then be used to obtain a residual overlay performance indicator (ROPI) of the alignment. A larger ROPI value indicates poorer alignment. The residual displacement OVL error measured by the OVL measurement tool 406 tool is sent to a controller 408 configured to iteratively change the height of the one or more of a plurality of raised contacts within the deformable electrostatic chuck 404 to minimize the residual displacement.

Figure 5:
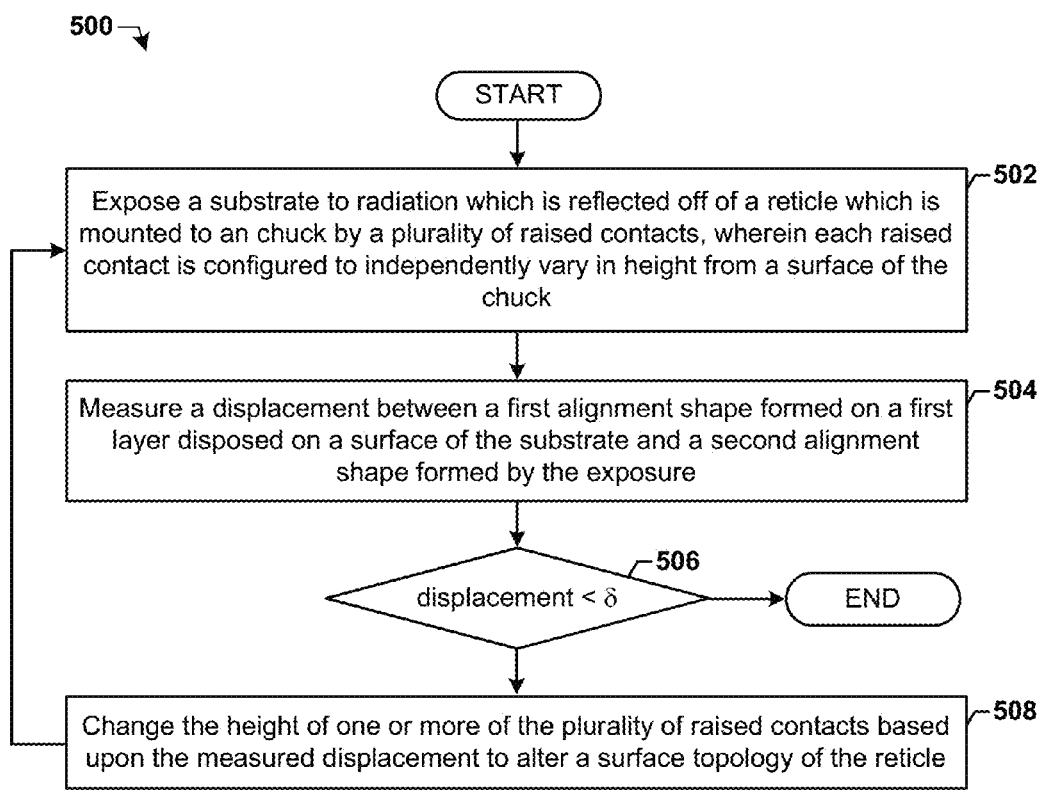
FIG. 5 illustrates some embodiments of a method of overlay control using a deformable electrostatic chuck.

FIG. 5 illustrates some embodiments of a method 500 of overlay control using a deformable electrostatic chuck.

At 502 a substrate is exposed to radiation which is reflected off of a reticle which is mounted to an chuck by a plurality of raised contacts, wherein each raised contacts is configured to independently vary in height from a surface of the chuck.

At 504 a displacement between a first alignment shape formed on a first layer disposed on a surface of the substrate and a second alignment shape formed by the exposure is measured by an OVL measurement tool, and reported to a controller. In some embodiments, the first and second layers comprise manufacturing layers (e.g., polysilicon, metal, etc.). In some embodiments, the first layer comprises a manufacturing layer and the second layer comprises a photoresist layer.

At 506 a determination is made as to whether the displacement is within an acceptable limit ($\delta$). If the displacement is within the acceptable limit, then the method 500 is complete. If the displacement is not within the acceptable limit, then the method 500 proceeds to 508.

At 508 the height of a raised contact is changed based upon the measured displacement, to alter a surface topology of the reticle. The height of a raised contact is changed by supplying a current from an individual electric supply coupled to a resistive material disposed beneath the raised contact, which results in a thermal expansion or compression of the resistive material. In some embodiments, the raised contacts comprise an ultra-low expansion (ULE) material configured to exhibit minimal thermal expansion compared to the resistive material. However, it does exhibit comparable mechanical deformation to the resistive material, which changes the height of the raised contact when the current is supplied to the resistive material. After the height of the raised contact is changed, the method 500 returns to 502.

In the aforementioned embodiments, wherein the second layer comprises a photoresist layer and the displacement is not within the acceptable limit, the second layer is removed after measuring the displacement between the first alignment shape and the second alignment shape. And, a third layer comprising a photoresist layer is disposed in place of the second layer after changing the height of the one or more of the plurality of raised contacts prior to returning to 502. The method 500 will continue to iteratively change the height of the raised contact to minimize the displacement to within the acceptable limit (δ). Thereafter, the change in the height of the raised contacts is applied to subsequent exposures of additional substrates.

Therefore, it will be appreciated that some embodiments of the present disclosure relate to a deformable electrostatic chuck configured to improve overlay control, and associated methods of formation and use.

In some embodiments, the present disclosure relates to an extreme ultraviolet (EUV) deformable reticle chuck. The EUV deformable reticle chuck comprises a substrate of insulating material having a plurality of protrusions extending outward from a first side of the substrate. The EUV deformable reticle chuck further comprises a resistive material arranged along a second side of the substrate below the plurality of protrusions. The resistive material is configured to expand in response to an applied current or voltage to adjust a shape of a reticle.

In other embodiments, the present disclosure relates to method of forming a deformable reticle chuck. The method comprises recessing areas of a first side of a substrate of insulating material to form a plurality of protrusions extending outward from the first side. The method further comprises recessing areas of a second side of the substrate to form recessed areas within the second side at locations below the plurality of protrusions. The method further comprises forming a resistive material within the recessed areas of the second side of the substrate, wherein the resistive material is configured to expand in response to an applied current or voltage to adjust a shape of a reticle.

In yet other embodiments, the present disclosure relates an extreme ultraviolet (EUV) lithography system. The EUV lithography system comprises an exposure tool having an EUV reticle coupled to a deformable reticle chuck. The deformable reticle chuck has a plurality of protrusions extending outward from a substrate of insulating material at locations overlying a resistive material that is configured to expand in response to an applied current or voltage. An overlay measurement tool is configured to measure overlay errors. A controller is configured receive the overlay errors from the overlay measurement tool and to alter a surface topology of the EUV reticle by applying a current or voltage to the resistive material to change a height of one or more of the plurality of protrusions based upon the overlay errors.

Although the disclosure has been shown and described with respect to a certain aspect or various aspects, equivalent alterations and modifications will occur to others of ordinary skill in the art upon reading and understanding this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the disclosure. In addition, while a particular feature of the disclosure may have been disclosed with respect to only one of several aspects of the disclosure, such feature may be combined with one or more other features of the other aspects as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. An extreme ultraviolet (EUV) deformable reticle chuck, comprising:
    a substrate of insulating material comprising a plurality of protrusions extending outward from a first side of the substrate; and
    a resistive material arranged along a second side of the substrate below the plurality of protrusions, wherein the resistive material is configured to expand in response to an applied current or voltage to adjust a shape of a reticle.

2. The deformable reticle chuck of claim 1, further comprising:
    a layer of insulating material arranged along an opposite side of the resistive material as the substrate.

3. The deformable reticle chuck of claim 2, wherein the substrate and the layer of insulating material comprise a same material.

4. The deformable reticle chuck of claim 2, wherein the layer of insulating material comprises an ultra low expansion material.

5. The deformable reticle chuck of claim 2, further comprising:
    a plurality of electrodes embedded within a dielectric layer separated from the second side of the substrate by the layer of insulating material, wherein the plurality of electrodes overlie the plurality of protrusions.

6. The deformable reticle chuck of claim 5, wherein the plurality of electrodes extend through the dielectric layer to contact the layer of insulating material.

7. The deformable reticle chuck of claim 1, further comprising:
    a ceramic material arranged on an opposite side of the plurality of protrusions as the resistive material.

8. The deformable reticle chuck of claim 7, wherein the ceramic material comprises titanium nitride.

9. The deformable reticle chuck of claim 1, wherein the resistive material comprises lightly-doped silicon dioxide.

10. The deformable reticle chuck of claim 1, further comprising:
    an EUV reticle arranged over the plurality of protrusions.

11. A method of forming a deformable reticle chuck, comprising:
    recessing areas of a first side of a substrate of insulating material to form a plurality of protrusions extending outward from the first side;
    recessing areas of a second side of the substrate to form recessed areas within the second side at locations below the plurality of protrusions; and
    forming a resistive material within the recessed areas of the second side of the substrate, wherein the resistive material is configured to expand in response to an applied current or voltage to adjust a shape of a reticle.

12. The method of claim 11, further comprising:
    forming a ceramic material on an opposite side of the plurality of protrusions as the resistive material.

13. The method of claim 12, wherein forming the ceramic material comprises:

forming a masking layer over the first side of the substrate and the plurality of protrusions;
selectively removing the masking layer to form openings over the plurality of protrusions;
depositing the ceramic material within the openings and over the masking layer; and
removing the masking layer and the ceramic material over the masking layer.

14. The method of claim 12, wherein the ceramic material comprises titanium nitride.

15. The method of claim 11, further comprising:
forming a layer of insulating material along an opposite side of the resistive material as the substrate.

16. The method of claim 15, further comprising:
coupling the layer of insulating material to a plurality of electrodes arranged within a dielectric layer, wherein the dielectric layer is arranged along an opposite side of layer of insulating material as the resistive material.

17. The method of claim 16, wherein the plurality of electrodes underlie the plurality of protrusions.

18. An extreme ultraviolet (EUV) lithography system, comprising:
an exposure tool comprising an EUV reticle coupled to a deformable reticle chuck, wherein the deformable reticle chuck has a plurality of protrusions extending outward from a substrate of insulating material at locations overlying a resistive material that is configured to expand in response to an applied current or voltage;
an overlay measurement tool configured to measure overlay errors; and
a controller configured receive the overlay errors from the overlay measurement tool and to alter a surface topology of the EUV reticle by applying a current or voltage to the resistive material to change a height of one or more of the plurality of protrusions based upon the overlay errors.

19. The EUV system of claim 18, wherein the controller is configured to iteratively change the height of the one or more of the plurality of protrusions to reduce the overlay errors.

20. The EUV system of claim 18, wherein measuring the overlay errors comprises:
measuring a displacement between a first alignment shape formed on a first layer disposed on a surface of a semiconductor substrate and a second alignment shape formed on a second layer disposed on the surface of the semiconductor substrate.

* * * * *